(12) United States Patent
Wu

(10) Patent No.: US 6,673,998 B1
(45) Date of Patent: Jan. 6, 2004

(54) ELECTROMAGNETIC SHIELDING DEVICE WITH HEAT-DISSIPATING CAPABILITY

(75) Inventor: Kuo-Tai Wu, Taipei (TW)

(73) Assignee: Accton Technology Corporation (TW)

( * ) Notice: Subject to any disclaimer, the term of this patent is extended or adjusted under 35 U.S.C. 154(b) by 0 days.

(21) Appl. No.: 10/337,027

(22) Filed: Jan. 2, 2003

(51) Int. Cl.[7] .............................................. H05K 9/00
(52) U.S. Cl. ............................. 174/35 GC; 361/816; 361/719
(58) Field of Search .................... 174/35 GC, 35 R; 361/816, 818, 717, 718, 719, 752

(56) References Cited

U.S. PATENT DOCUMENTS

| | | | | |
|---|---|---|---|---|
| 4,235,285 A | * | 11/1980 | Johnson et al. | 165/80.3 |
| 5,287,001 A | * | 2/1994 | Buchmann et al. | 257/719 |
| 6,025,991 A | * | 2/2000 | Saito | 361/704 |
| 6,049,469 A | * | 4/2000 | Hood et al. | 361/818 |
| 6,388,189 B1 | * | 5/2002 | Onoue | 174/35 R |

* cited by examiner

Primary Examiner—Dean A. Reichard
Assistant Examiner—Carmelo Oliva
(74) Attorney, Agent, or Firm—Ostrolenk, Farber, Gerb & Soffen, LLP

(57) ABSTRACT

An electromagnetic shielding device includes a hollow shielding frame and an elongate resilient member. The shielding frame is made of metal, has an open bottom side, and confines a component-receiving space that is accessible from the open bottom side. The open bottom side of the shielding frame is adapted to be mounted on a circuit board such that an electronic component on the circuit board extends into the component-receiving space through the open bottom side. The resilient member is made of a heat-conductive material, is disposed in the component-receiving space, and has a contact portion adapted to contact the electronic component in the component-receiving space for dissipating heat generated by the electronic component, and at least one resilient arm portion for connecting the contact portion to the shielding frame.

12 Claims, 4 Drawing Sheets

I # ELECTROMAGNETIC SHIELDING DEVICE WITH HEAT-DISSIPATING CAPABILITY

BACKGROUND OF THE INVENTION

1. Field of the Invention

The invention relates to an electromagnetic shielding device, more particularly to an electromagnetic shielding device with a heat-dissipating capability.

2. Description of the Related Art

Referring to FIG. 1, a conventional electromagnetic shielding-device 7 is shown to include a frame body 71 and a shielding body 72. The electromagnetic shielding device 7 is adapted to be used for shielding an integrated circuit chip 81 mounted on a circuit board 8 to protect the integrated circuit chip 81 from electromagnetic interference.

Since the conventional electromagnetic shielding device 7 does not have direct contact with the integrated circuit chip 81, the electromagnetic shielding device 7 only provides a function of electromagnetic shielding, and does not provide a function of heat dissipating. Particularly, the heat generated by the integrated circuit chip 81 can only be dissipated through the air inside the electromagnetic shielding device 7, and then indirectly through the frame body 71 and the shielding body 72 of the electromagnetic shielding device 7. However, air is not a good heat conductor. Moreover, the air inside the electromagnetic shielding device 7 does not flow easily. Furthermore, the heat conducted by air still needs to pass through the frame body 71 and the shielding body 72 for dissipation. It is therefore evident from the foregoing that the conventional electromagnetic shielding device 7 only provides a function of electromagnetic shielding, and does not provide a function of heat dissipating. As such, the electromagnetic shielding device 7 is not suitable for application to integrated circuit chips that have wide operating bandwidths and that consume large amounts of electrical power. Such integrated circuit chips require specially designed electromagnetic shielding devices that have a heat-dissipating capability so as to maintain a normal working temperature for the chips.

On the other hand, as shown in FIG. 1, the size of the conventional electromagnetic shielding device 7 is much larger than that of the integrated circuit chip 81, and the conventional electromagnetic shielding device 7 is not partitioned into a number of compartments. Therefore, if only one integrated circuit chip 81 is shielded by the conventional electromagnetic shielding device 7, a lot of space on the circuit board 8 will be wasted, which does not meet the current requirement of minimizing the size of electronic products. However, if, aside from the integrated circuit chip 81, other electronic components or integrated circuit chips are enclosed within the conventional electromagnetic shielding device 7, since these electronic components or integrated circuit chips are not placed in different compartments, it is possible that mutual electromagnetic interference among the electronic components and/or integrated circuit chips will occur inside the electromagnetic shielding device 7.

Moreover, if the size of the conventional electromagnetic shielding device 7 is custom-made to match that of the integrated circuit chip 81, different sizes of the electromagnetic shielding device 7 will have to be prepared, thereby increasing the manufacturing cost of the conventional electromagnetic shielding device 7.

SUMMARY OF THE INVENTION

Therefore, the object of the present invention is to provide an electromagnetic shielding device with a heat-dissipating capability and capable of overcoming the aforesaid drawbacks of the prior art.

Accordingly, the electromagnetic shielding device of this invention is adapted for use with a circuit board that has an electronic component mounted thereon. The electromagnetic shielding device comprises:

a hollow shielding frame made of metal and having an open bottom side, the shielding frame confining a component-receiving space that is accessible from the open bottom side, the open bottom side of the shielding frame being adapted to be mounted on the circuit board such that the electronic component on the circuit board extends into the component-receiving space through the open bottom side; and an elongate resilient member made of a heat-conductive material, the resilient member being disposed in the component-receiving space and having a contact portion adapted to contact the electronic component in the component-receiving space for dissipating heat generated by the electronic component, and at least one resilient arm portion for connecting the contact portion to the shielding frame.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
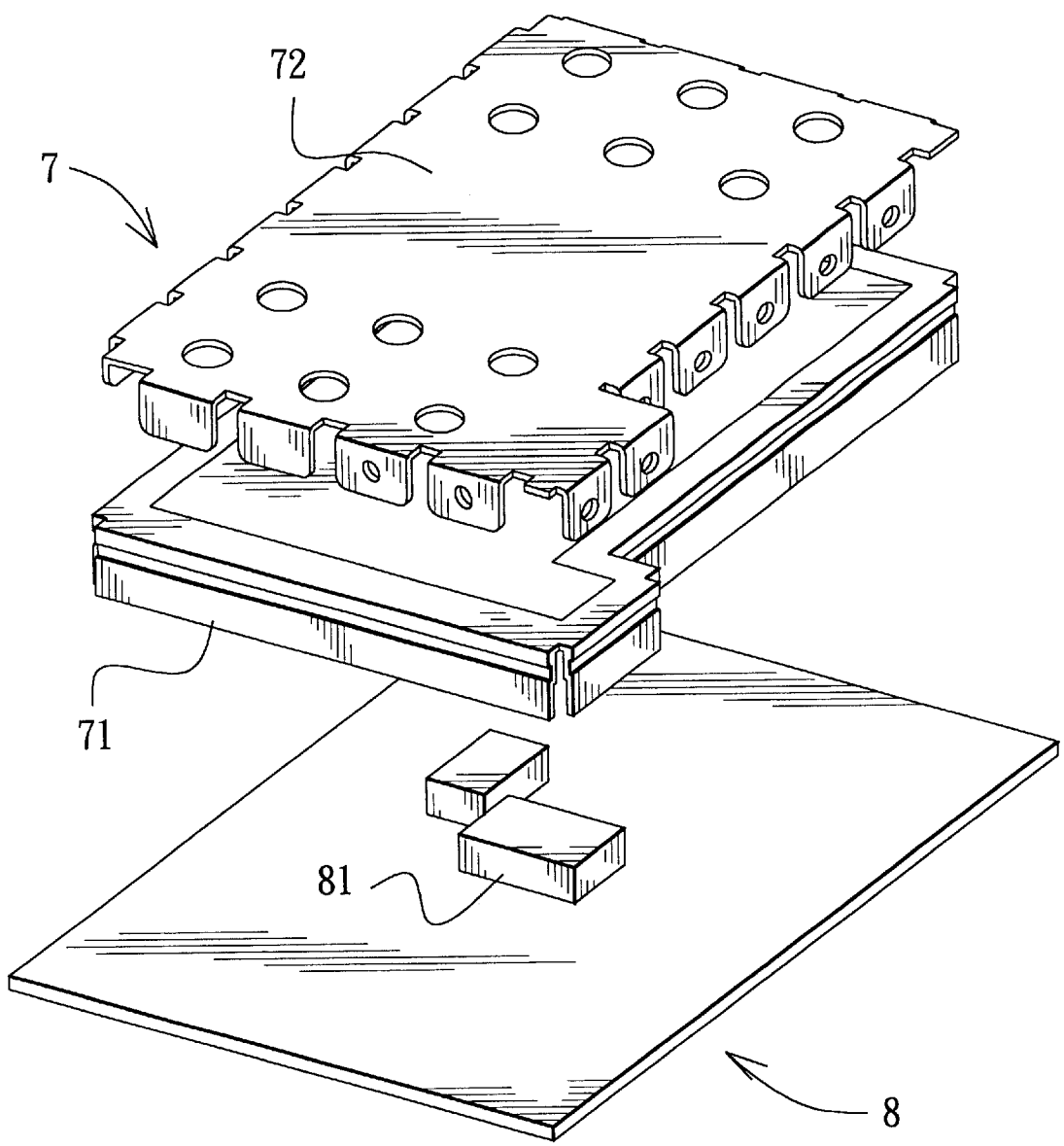
FIG. 1 is an exploded perspective view of a conventional electromagnetic shielding device.
Figure 2:
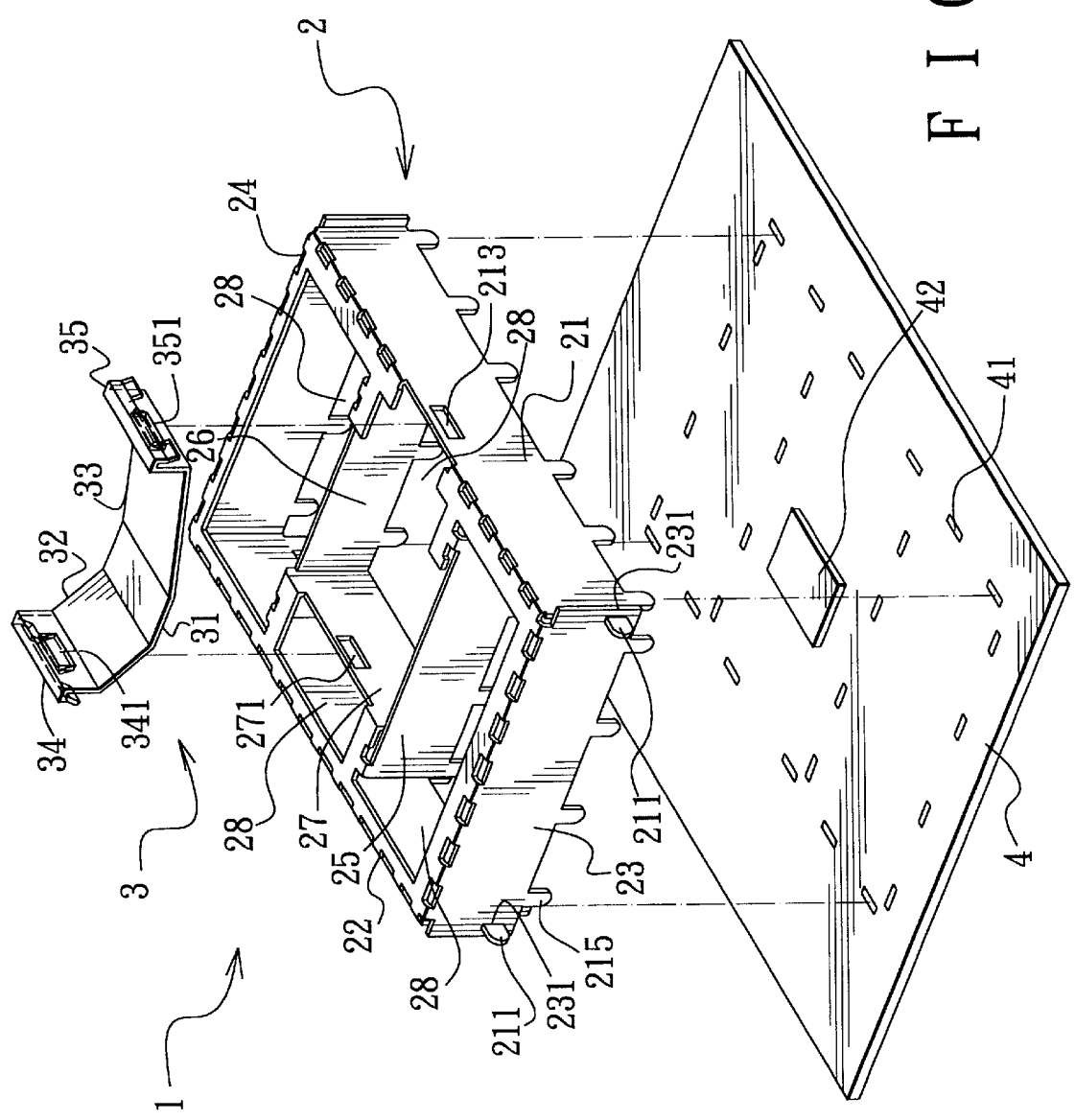
FIG. 2 is an exploded perspective view of the preferred embodiment of an electromagnetic shielding device according to the present invention.
Figure 3:
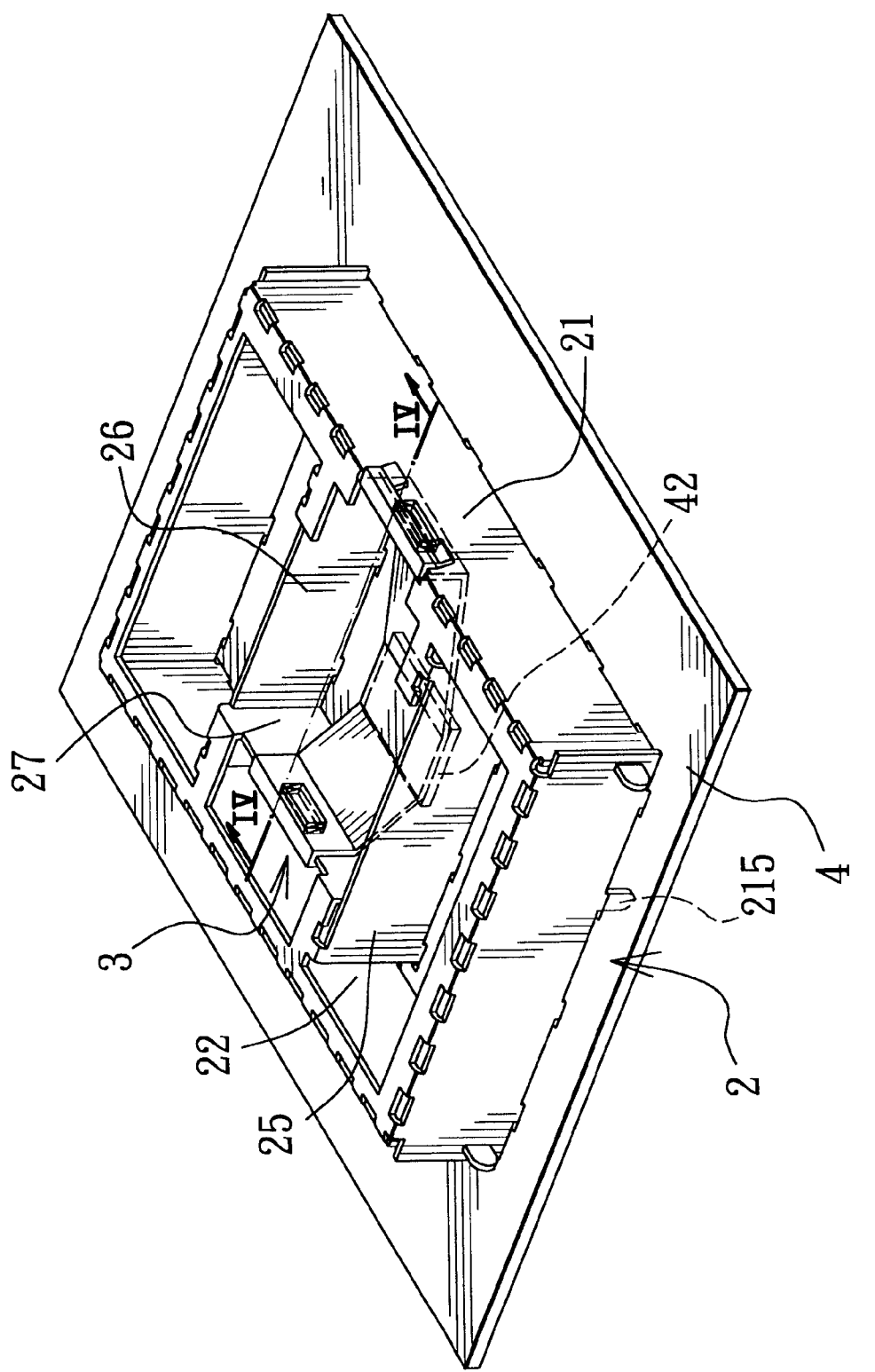
FIG. 3 is an assembled perspective view of the preferred embodiment.
Figure 4:
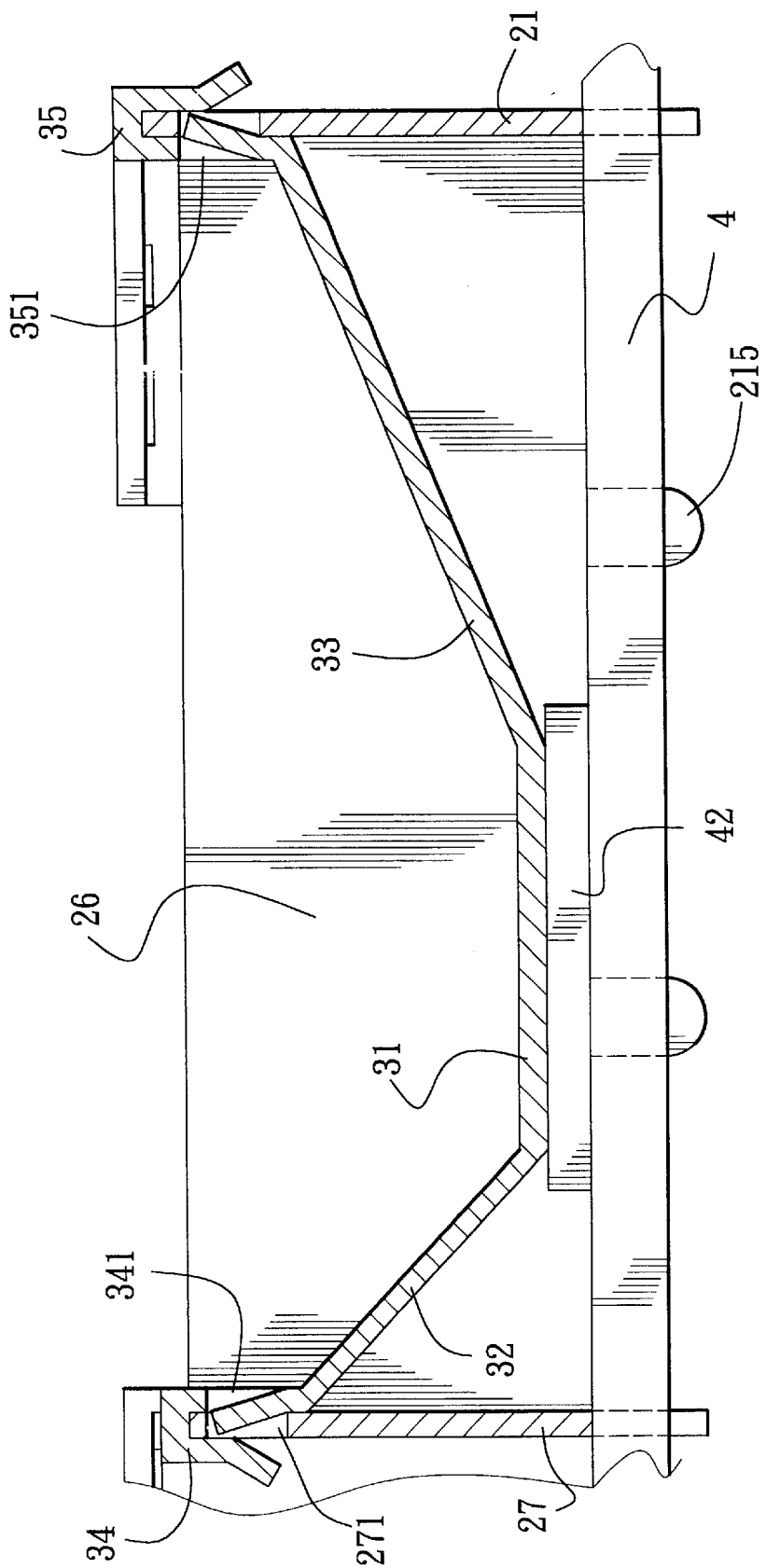
FIG. 4 is a schematic cross-sectional view of the preferred embodiment, taken along line IV—IV of FIG. 3.

Referring to FIGS. 2, 3 and 4, the preferred embodiment of an electromagnetic shielding device 1 according to the present invention is shown to include a hollow shielding frame 2 and an elongate resilient member 3 mounted on the shielding frame 2.

The shielding frame 2 is made of a metal sheet that is punched and bent to form a rectangular container with open top and bottom sides. The shielding frame 2 includes an opposite longer pair of first and second walls 21, 22, an opposite shorter pair of third and fourth walls 23, 24, a pair of first and second partition walls 25, 26 extending from the first wall 21 toward the second wall 22 and parallel to the third and fourth walls 23, 24, and a third partition wall 27 parallel to and spaced apart from the first and second walls 21, 22 and interconnecting the first and second partition walls 25, 26. The walls 21, 22, 23, 24, 25, 26 and 27 cooperate to define a plurality of component-receiving spaces 28. Each of the first and second walls 21, 22 has a lateral end formed with a lug 211. Each of the third and fourth walls 23, 24 has a lateral end formed with a lug hole 231 for engaging the lug 211 on a corresponding lateral end of the first and second walls 21, 22, thereby holding the rectangular shape of the shielding frame 2. Due to the presence of the first, second and third partition walls 25, 26, 27, the hollow interior of the shielding frame 2 can be partitioned into the component-receiving spaces 28.

In the preferred embodiment, the first wall 21 is formed with a first tab hole 213 proximate to the top edge thereof. The third partition wall 27 is formed with a second tab hole 271 proximate to the top edge thereof and registered with the first tab hole 213. Preferably, each of the walls 21, 22, 23, 24, 25, 26 and 27 is formed with a plurality of board-locking tongues 215 at the open bottom side of the shielding frame 2.

The resilient member 3 is preferably made from a punched heat-conductive metal plate. In this embodiment, the resilient member 3 includes a contact portion 31 and a pair of resilient first and second arm portions 32, 33, each of which extends upwardly and inclinedly from a respective one of two opposite lateral edges of the contact portion 31. Each of the first and second arm portions 32, 35 has a distal end opposite to the contact portion 31 and formed with a respective one of first and second hook members 34, 35, and a tab 341, 351 that is formed on the respective hook member 34, 35.

In the preferred embodiment, the first hook member 34 is hooked on the top edge of the third partition wall 27 such that the tab 341 on the first hook member 34 extends into the second tab hole 271 in the third partition wall 27. The second hook member 35 is hooked on the top edge of the first wall 21 such that the tab 351 on the second hook member 35 extends into the first tab hole 213 in the first wall 21.

The board-locking tongues 215 at the open bottom side of the shielding frame 2 are inserted into corresponding holes 41 formed in a circuit board 4. The tongues 215 are then either bent or soldered or both so as to mount the electromagnetic shielding device 1 on the circuit board 4. At this time, an electronic component 42, such as an integrated circuit chip, on the circuit board 4 extends into one of the component-receiving spaces 28 through the open bottom side of the shielding frame 2, and the contact portion 31 of the resilient member 3 abuts against the heat dissipating side of the electronic component 42. By virtue of the resiliency of the first and second arm portions 32, 33, the contact portion 31 will be urged toward the electronic component 42 for optimum contact therewith such that heat generated by the electronic component 42 will be conducted to the entire electromagnetic shielding device 1 through the resilient member 3. In view of the large overall heat dissipating area of the entire electromagnetic shielding device 1, a good heat-dissipating effect can be achieved. On the other hand, since different electronic components on the circuit board 4 can be disposed in different component-receiving spaces 28 of the shielding frame 2, mutual electromagnetic interference among the electronic components on the circuit board can be minimized.

Aside from being formed by punching, the shielding frame 2 of the electromagnetic shielding device 1 of this invention can also be integrally formed. As to the connection between the resilient member 3 and the shielding frame 2, the aforesaid hooking engagement therebetween may be strengthened by soldering. Furthermore, since the electromagnetic shielding device 1 of this invention includes a plurality of component-receiving spaces 28 of different sizes, one electromagnetic shielding device 1 can be used to shield different sizes of electronic components 42 on the circuit board 4. Moreover, each of the walls 21, 22, 23, 24, 25 and 26 can be formed with a tab hole 213 or 271 so that the resilient member 3 can be installed in each component-receiving space 28 for dissipating the heat generated by the electronic component in the corresponding space 28.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An electromagnetic shielding device adapted for use with a circuit board that has an electronic component mounted thereon, said electromagnetic shielding device comprising:

a hollow shielding frame made of metal and having an open bottom side, said shielding frame confining a component-receiving space that is accessible from said open bottom side, said open bottom side of said shielding frame being adapted to be mounted on the circuit board such that the electronic component on the circuit board extends into said component-receiving space through said open bottom side; and an elongate resilient member made of a heat-conductive material, said resilient member being disposed in said component-receiving space and having a contact portion adapted to contact the electronic component in said component-receiving space for dissipating heat generated by the electronic component, and at least one resilient arm portion for connecting said contact portion to said shielding frame.

2. The electromagnetic shielding device as claimed in claim 1, wherein said shielding frame has a wall formed with a tab hole, and said resilient arm portion has a distal end opposite to said contact portion and formed with a tab that extends into said tab hole.

3. The electromagnetic shielding device as claimed in claim 1, wherein said shielding frame has a top edge opposite to said open bottom side, and said resilient arm portion has a distal end opposite to said contact portion and formed with a hook member for hooking on said top edge of said shielding frame.

4. The electromagnetic shielding device as claimed in claim 1, wherein said shielding frame includes a wall that has a top edge opposite to said open bottom side and that is formed with a tab hole, said resilient arm portion having a distal end opposite to said contact portion and formed with a hook member for hooking on said top edge of said wall of said shielding frame, and a tab that is formed on said hook member and that extends into said tab hole.

5. The electromagnetic shielding device as claimed in claim 1, wherein said shielding frame has an opposing pair of walls that define two opposite sides of said component-receiving space, said contact portion of said resilient member having two opposite lateral edges, said resilient member including two of said resilient arm portions, each of which extends upwardly and inclinedly from a respective one of said lateral edges of said contact portion, and each of which has a distal end anchored on a respective one of said opposing pair of walls of said shielding frame.

6. The electromagnetic shielding device as claimed in claim 5, wherein each of said walls in said opposing pair has a top edge opposite to said open bottom side and is formed with a tab hole, said distal end of each of said resilient arm portions being formed with a hook member for hooking on said top edge of the respective one of said walls in said opposing pair, and a tab that is formed on said hook member and that extends into said tab hole in the respective one of said walls in said opposing pair.

7. The electromagnetic shielding device as claimed in claim 1, wherein said open bottom side of said shielding frame is formed with a plurality of board-locking tongues.

8. An electromagnetic shielding device adapted for use with a circuit board that has at least one electronic component mounted thereon, said electromagnetic shielding device comprising:

a hollow shielding frame made of metal and having an open bottom side and a plurality of walls which cooperate to confine at least two component-receiving spaces that are accessible from said open bottom side, said open bottom side of said shielding frame being adapted to be mounted on the circuit board such that each electronic component on the circuit board extends into one of said component-receiving spaces through said open bottom side; and an elongate resilient member made of a heat-conductive material, said resilient member being disposed in one of said component-receiving spaces and having a contact portion adapted to contact the electronic component in said one of said component-receiving spaces for dissipating heat generated by the electronic component, said contact portion having two opposite lateral edges, said resilient member further having a pair of resilient arm portions, each of which extends from a respective one of said lateral edges of said contact portion, said resilient arm portions having distal ends opposite to said contact portion and anchored respectively on an opposing pair of said walls of said shielding frame that define two opposite sides of said one of said component-receiving spaces, said resilient arm portions urging said contact portion toward the electronic component in said one of said component-receiving spaces.

9. The electromagnetic shielding device as claimed in claim 8, wherein each of said walls in said opposing pair is formed with a tab hole, and said distal end of each of said resilient arm portions is formed with a tab that extends into said tab hole in the respective one of said walls.

10. The electromagnetic shielding device as claimed in claim 8, wherein each of said walls in said opposing pair has a top edge opposite to said open bottom side, and said distal end of each of said resilient arm portions is formed with a hook member for hooking on said top edge of the respective one of said walls.

11. The electromagnetic shielding device as claimed in claim 8, wherein each of said walls in said opposing pair has a top edge opposite to said open bottom side and is formed with a tab hole, said distal end of each of said resilient arm portions being formed with a hook member for hooking on said top edge of the respective one of said walls, and a tab that is formed on said hook member and that extends into said tab hole in the respective one of said walls.

12. The electromagnetic shielding device as claimed in claim 8, wherein said walls of said shielding frame are formed with a plurality of board-locking tongues at said open bottom side.

* * * * *